United States Patent
Sakemi

Patent Number: 5,983,490
Date of Patent: *Nov. 16, 1999

[54] CONDUCTIVE BALL MOUNTING APPARATUS

[75] Inventor: Shoji Sakemi, Fukuoka, Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/888,132

[22] Filed: Jul. 3, 1997

[30] Foreign Application Priority Data

Aug. 20, 1996 [JP] Japan .................................. 8-218175

[51] Int. Cl.⁶ ........................................... H05K 3/30
[52] U.S. Cl. ........................... 29/833; 29/832; 29/840; 29/843; 29/854; 29/DIG. 44; 29/743
[58] Field of Search ............................. 29/714, 720, 721, 29/705, 825, 833, 854, 832, 840, 843, 743, 741; 356/394, 237; 228/41

[56] References Cited

U.S. PATENT DOCUMENTS

| | | | |
|---|---|---|---|
| 4,851,902 | 7/1989 | Tezuka et al. | 358/101 |
| 5,323,528 | 6/1994 | Baker | 29/721 |
| 5,467,913 | 11/1995 | Namekawa et al. | 228/41 |
| 5,657,528 | 8/1997 | Sakemi et al. | 29/430 |
| 5,695,667 | 12/1997 | Eguchi et al. | 29/741 |

*Primary Examiner*—Lee Young
*Assistant Examiner*—Rick Kiltae Chang
*Attorney, Agent, or Firm*—Stevens, Davis, Miller & Mosher, L.L.P.

[57] ABSTRACT

A suction head has a plurality of suction units. The respective suction units have spaces each connected with a vacuum pump through a first valve. A sensor observes works on a substrate to inspect whether or not a bad mark is marked on the works. The spaces are separated from one another so that only the spaces corresponding to works of good quality with no bad mark are vacuum-evacuated so as to vacuum-suck conductive balls, while preventing the space corresponding to defective work or works with the bad mark from being vacuum-evacuated by closing a first valve so as to cancel the mounting of the conductive balls.

4 Claims, 7 Drawing Sheets

| SUBSTRATE ID | WORK 3A | WORK 3B | WORK 3C | WORK 3D |
|---|---|---|---|---|
| 00001 | 0 | 0 | 0 | 0 |
| 00002 | 0 | 0 | 0 | 0 |
| 00003 | 0 | 0 | 0 | 0 |
| ⋮ | | | | |
| 00018 | 0 | 1 | 0 | 0 |
| ⋮ | | | | |

CONDUCTIVE BALL MOUNTING APPARATUS

BACKGROUND OF THE INVENTION

1. Field of the Invention

The present invention relates to a conductive ball mounting apparatus and a mounting method for mounting conductive balls on pads of a circuit pattern of a work.

2. Description of the Prior Art

As a method of manufacturing a bump work such as a flip-chip, there has been known one in which conductive balls are used. In this method, after the conductive balls such as solder balls are mounted on pads of a circuit pattern of a work, the work is sent into a heating furnace where the conductive balls and solder for soldering the conductive balls are heated to melt, and then the work is cooled to solidify the conductive balls and the solder, thereby forming bumps on the pads of the work.

Meanwhile, as a method for mounting conductive balls on pads of a work, there has been known one in which a suction head is used. In this method, conductive balls received in a container or the like are picked up through vacuum-suction by suction holes formed in an underside of the suction head to be mounted on pads of a work. According to this method, it is advantageously possible to mount the conductive balls on a large number of pads of the work at a time.

Conventionally, a plurality of suction holes corresponding to one work are formed in an underside of a suction head, which is adapted to mount the conductive balls on one work at a time. However, a method in which the conductive balls are mounted on one work at a time, does not result in an improvement in work efficiency. It is therefore contemplated that suction holes corresponding to a plurality of works are formed in the underside of the suction head to permit the conductive balls to be mounted on the plurality of works at one time, i.e., in a single series of actions.

On the other hand, a circuit pattern formed on an upper surface of a work may have a defect such as a bridge or a cavity. In the case where the conductive balls are mounted on the plurality of works at one time by means of the suction head as described above, a work having a defective circuit pattern may be included in the plurality of works, which results in manufacturing a defective bump work. Further, the same may be said of the case where defective works are produced in other processes before the conductive balls are mounted.

SUMMARY OF THE INVENTION

It is an object of the present invention to provide a conductive ball mounting apparatus and a mounting method, by which conductive balls can be mounted on a plurality of works by means of a suction head. More specifically, it is the object to provide a conductive ball mounting apparatus and a mounting method, in which, when a defective work is included among a plurality of works, conductive balls can be mounted only on works of good quality except for the defective work.

In a first embodiment of the invention, there is provided a conductive ball mounting apparatus comprising a work conveying path on which a plurality of works are conveyed as a group, a conductive ball supply unit, a suction head adapted to pick up conductive balls received in the supply unit to mount them together on pads formed in lands of the plurality of works, and means for moving the suction head between the supply unit and the works, and wherein the suction head has a plurality of suction units each having a separate space and being formed at an underside thereof with suction holes for conductive ball, and is provided with vacuum-evacuation means for individually vacuume-vacuating the spaces and a control unit for controlling the vacuum-evacuation means.

In a second embodiment of the invention, there is provided a conductive ball mounting method in which conductive balls are mounted on pads of a plurality of works, which are conveyed as a group on a work conveying path, at a time by means of a suction head having a plurality of suction units corresponding to the respective works, the method comprising the steps of detecting whether or not a defective work is included among the plurality of works, and canceling the mounting of conductive balls on the defective work by means of the suction unit when detecting the defective work.

In still another embodiment of the invention, there is provided a conductive ball mounting method in which conductive balls are mounted on a multi-piece substrate, which comprises a plurality of works, by means of a suction head having a plurality of suction units corresponding to the respective works, the method comprising the steps of inspecting each of the works, picking up conductive balls by means of the suction units corresponding to the works except a defective work, and mounting the conductive balls on the works of good quality at one time.

According to the present invention, it is possible to mount the conductive balls on a plurality of works at one time, i.e., in a single series of actions. Further, in those cases where a defective work is included in the plural works, the conductive balls can be mounted only on the good works while canceling the mounting of the conductive balls on the defective work.

DESCRIPTION OF THE PREFERRED EMBODIMENTS

Figure 1:
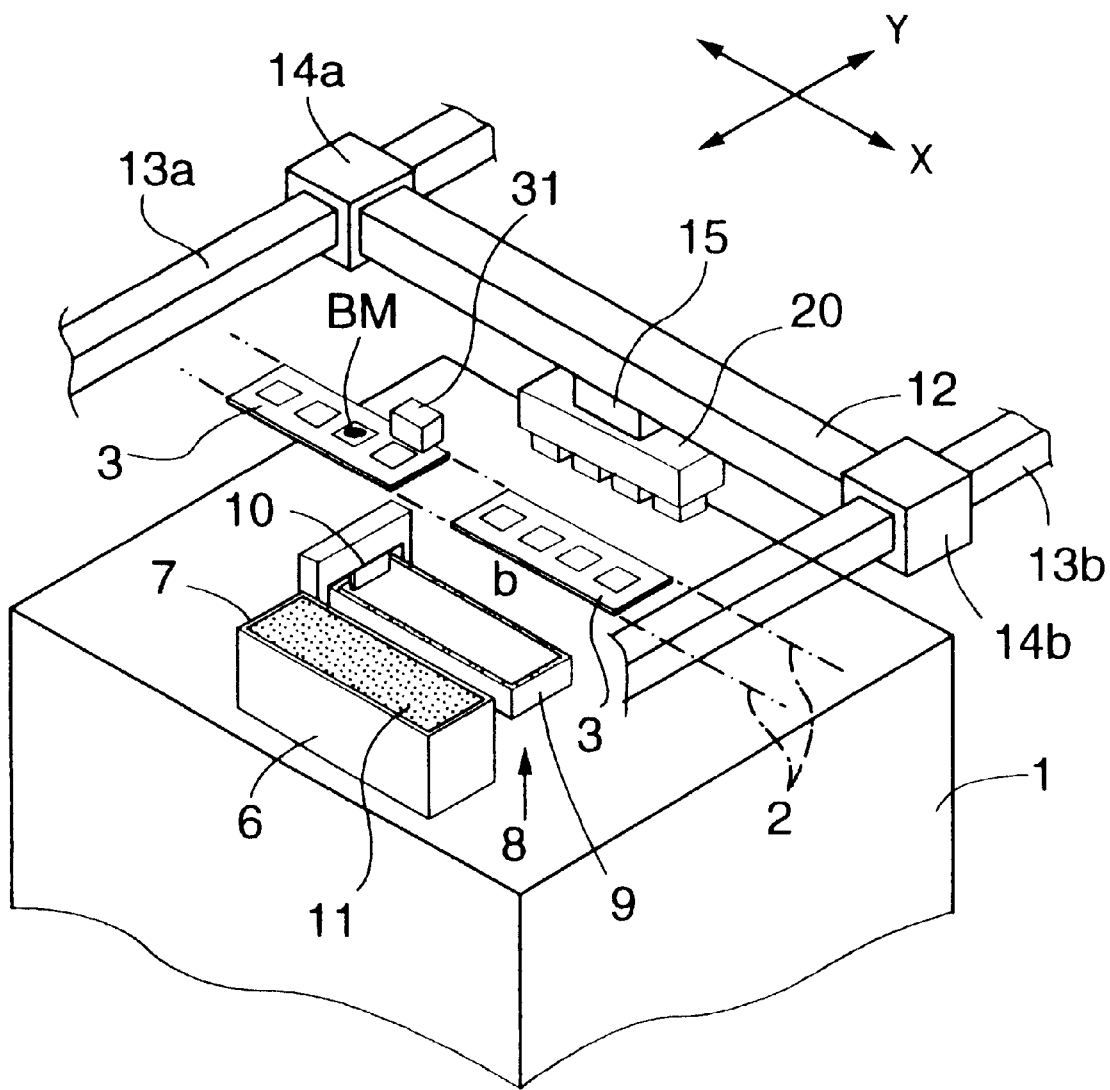
FIG. 1 is a perspective view of a conductive ball mounting apparatus according to a first embodiment of the present invention.
Figure 2:
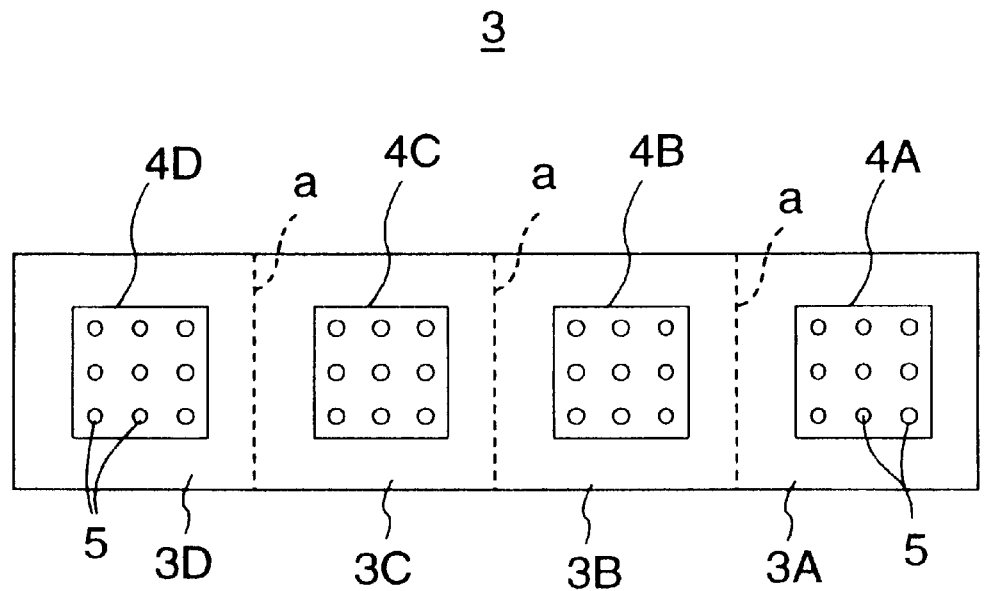
FIG. 2 is a plan view of a substrate in the first embodiment.
Figure 3:
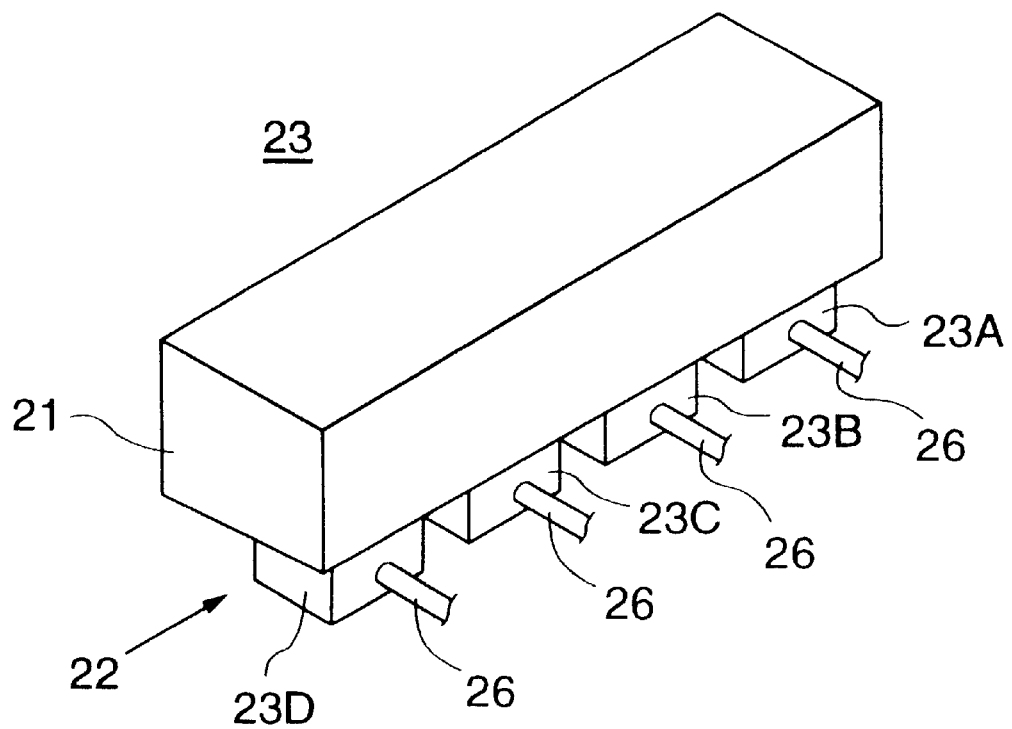
FIG. 3 is a perspective view of a suction head of the conductive ball mounting apparatus of the first embodiment.
Figure 4:
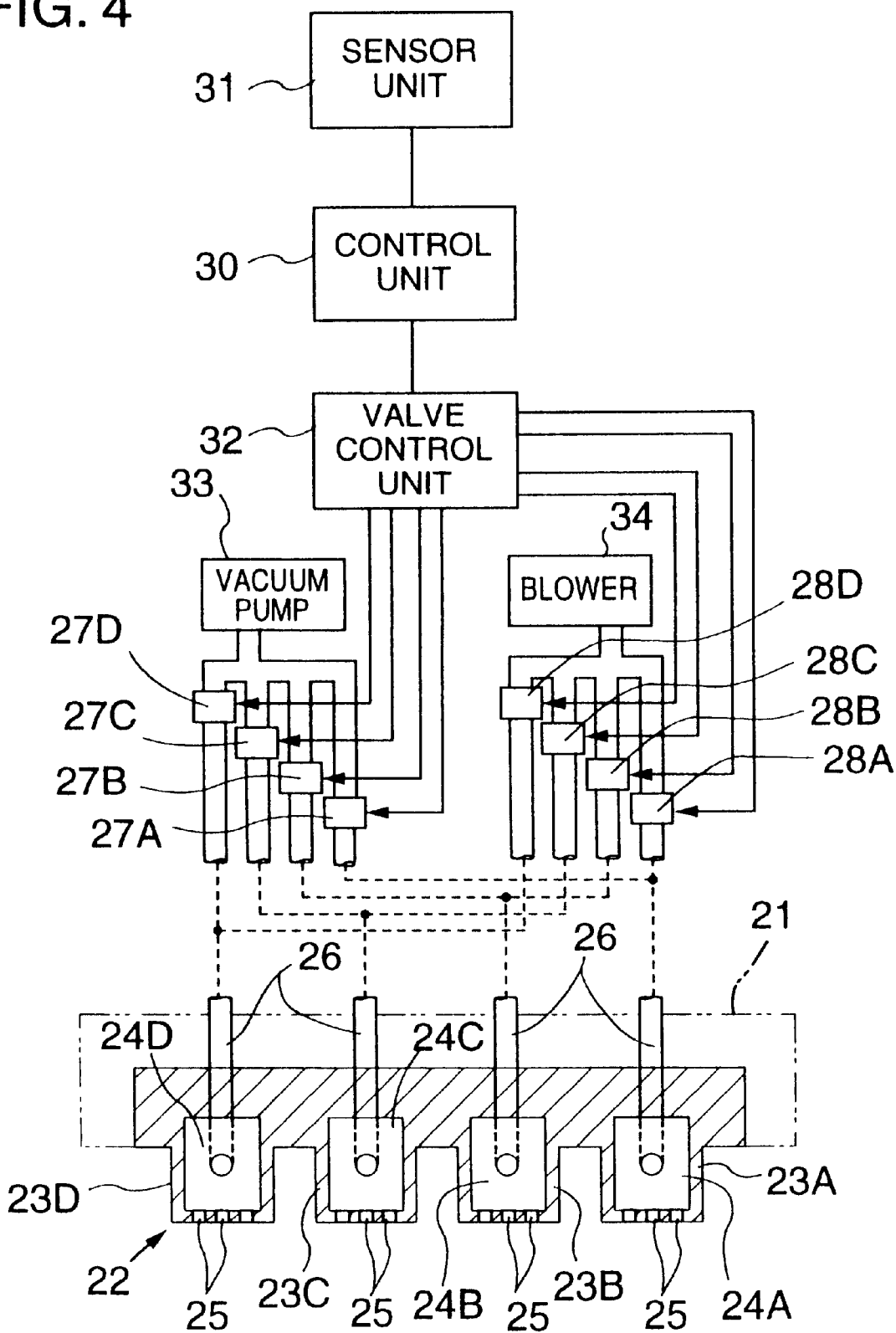
FIG. 4 is a block diagram of a vacuum suction system of the suction head of the conductive ball mounting apparatus according to the first embodiment.
Figure 5:
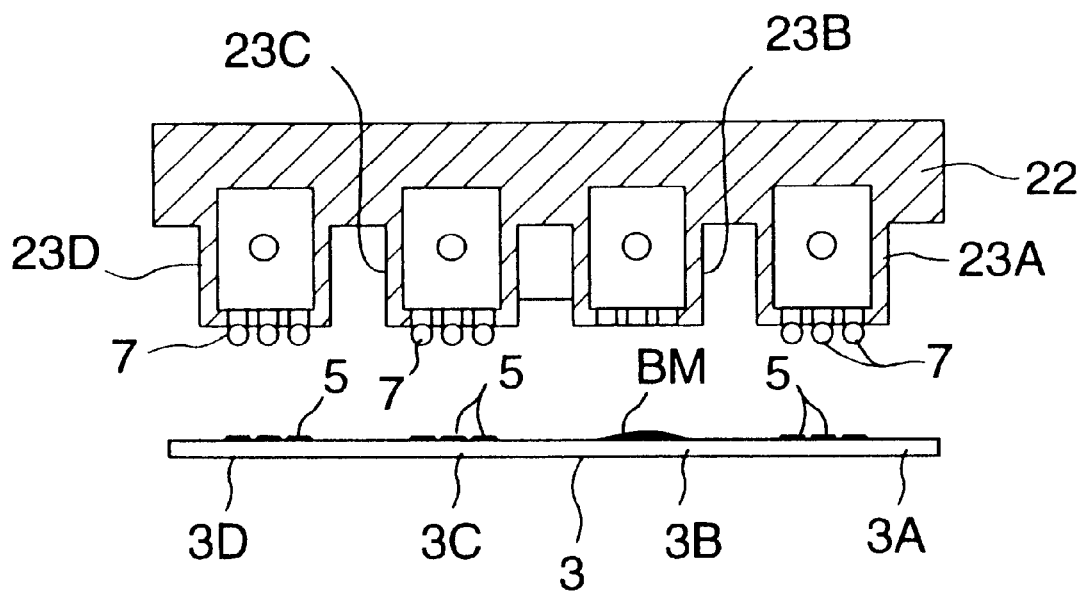
FIG. 5 is an explanatory view of an operation of the suction head of the conductive ball mounting apparatus according to the first embodiment.
Figure 6:
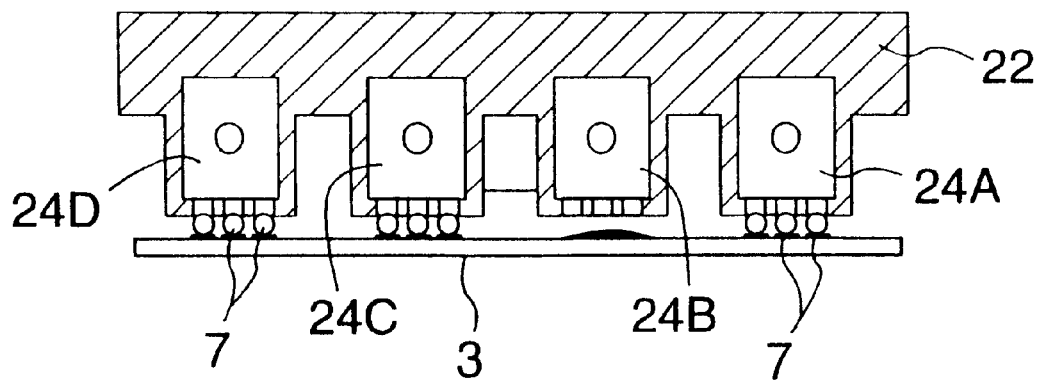
FIG. 6 is an explanatory view of an operation of the suction head of the conductive ball mounting apparatus according to the first embodiment.
Figure 7:
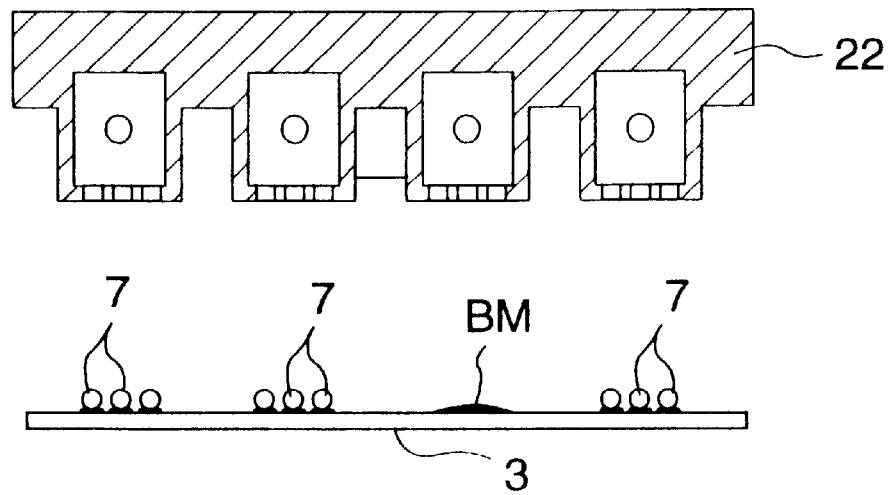
FIG. 7 is an explanatory view of an operation of the suction head of the conductive ball mounting apparatus in the first embodiment.
Figure 8:
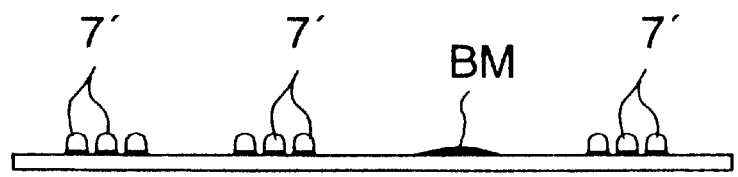
FIG. 8 is a view showing a bump forming process in the first embodiment.
Figure 9:
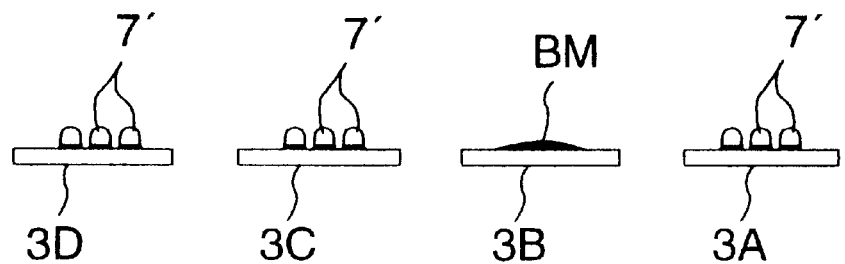
FIG. 9 is a view showing a bump work forming process in the first embodiment.

Now, preferred embodiments of the present invention will be described below with reference to the drawings. FIG. 1 is a perspective view of a conductive ball mounting apparatus according to a first embodiment of the invention, FIG. 2 is a plan view of a substrate in this embodiment, FIG. 3 is a perspective view of a suction head of the conductive ball mounting apparatus in the embodiment, FIG. 4 is a block diagram of a vacuum suction system of the suction head of the conductive ball mounting apparatus in the embodiment, FIGS. 5, 6 and 7 are explanatory views of an operation of the suction head of the conductive ball mounting apparatus in the embodiment, FIG. 8 is a view showing a bump forming process in the embodiment, and FIG. 9 is a view showing a bump work forming process in the embodiment.

First, a general construction of the conductive ball mounting apparatus will be described by referring to FIG. 1. A base 1 is provided on an upper surface thereof with a conveying path 2 for substrates 3. In FIG. 2, the substrate 3 comprises a wiring board such as a ceramic or glass-epoxy substrate. The substrate 3 is a multi-piece substrate and comprises four works 3A, 3B, 3C and 3D. By cutting off the substrate 3 along broken lines a in a subsequent step, four bump works 3A, 3B 3C and 3D can be produced at a time (see FIG. 9). In each of lands 4A, 4B, 4C and 4D of the works 3A to 3D, a large number of pads 5 constituting a circuit pattern are formed. This conductive ball mounting apparatus mounts thereon conductive balls all together at a time on the pads 5 of the plural (four, in this embodiment) works 3A to 3D conveyed integrally as one lump substrate on the conveying path 2.

In FIG. 1, a container 6 is provided on one side of the upper surface of the base 1. A large number of conductive balls 7 are put in the container 6. The container 6 serves as a supply portion for the conductive balls 7. Between the conveying path 2 and the container 6 is provided a flux applying portion 8. The flux applying portion 8 comprises a shallow container 9 and a squeegee 10. The squeegee 10 slides on the container 9 in a direction of arrow b so as to smooth the liquid surface of flux 11 stored in the container 9.

An X-direction guide rail 12 and Y-direction guide rails 13a, 13b are provided above the base 1. Opposite ends of the X-direction guide rail 12 are slidably supported by the Y-direction guide rails 13a, 13b through the medium of sliders 14a, 14b, respectively. A block 15 is mounted to an underside of the X-direction guide rail 12. A suction head 20 is held at the bottom of the block 15. The X-direction guide rail 12, Y-direction guide rails 13a, 13b and sliders 14a, 14b comprise a linear motor, and the suction head 20 can be moved horizontally in the X and Y directions. The block 15 has a built-in cylinder so that the suction head 20 is moved up and down by the actuation of the cylinder.

Next, referring to FIGS. 3 and 4, the suction head 20 and a vacuum suction system will be described below. In FIG. 3, the suction head 20 comprises an upper case 21 and a suction block 22 mounted to the bottom of the upper case 21. The suction block 22 comprises four suction units 23A, 23B, 23C and 23D. The four suction units 23A to 23D are aligned in a row so as to be able to mount the conductive balls on the four works 3A to 3D shown in FIG. 2 all together at a time. The suction units 23A to 23D are in the form of a box and have their respective spaces 24A, 24B, 24C and 24D inside thereof as shown in FIG. 4. The lower surface of each of the suction units 23A to 23D is formed therein with suction holes 25 for vacuum-sucking the conductive balls 7. The suction holes 25 are so formed as to be located in the positions corresponding to the pads 5 in the lands 4A to 4D of the works 3A to 3D.

Referring to FIG. 4, description will be given of the vacuum suction system. The reference numeral 30 denotes a control unit to which a sensor 31 and a valve control circuit 32 are connected. The control unit 30 comprises a CPU (Central Processing Unit). The respective spaces 24A to 24D are connected with a vacuum pump 33 and a blower 34 through a tube 26. First valves 27A, 27B, 27C and 27D are provided between the vacuum pump 33 and the spaces 24A to 24D, respectively. Further, second valves 28A, 28B, 28C and 28D are provided between the blower 34 and the spaces 24A to 24D, respectively. The valve control circuit 32 controls opening and closing of the first valves 27A to 27D and the second valves 28A to 28D. As the vacuum pump 33 is driven and the first valves 27A to 27D are opened, the respective spaces 24A to 24D are vacuum-evacuated so that the conductive balls 7 are vacuum-sucked in the suction holes 25. Meanwhile, when the blower 34 is driven and the second valves 28A to 28D are opened after the first valves 27A to 27D are closed, air is fed under pressure into the spaces 24A to 24D so that the vacuum in each of the spaces 24A to 24D is broken to cause the conductive balls 7 vacuum-sucked in the suction holes 25 to come off the latter.

In FIG. 1, the sensor 31 is provided above the conveying path 2. Although not shown, a product inspection apparatus for works is provided upstream of the conductive ball mounting apparatus to inspect the circuit pattern of the works 3A to 3D. If the circuit pattern is found to have a defect such as a bridge or a cavity, a bad mark BM as information on defects is marked on that defective work 3A, 3B, 3C or 3D. The sensor 31 monitors the works 3A to 3D conveyed on the conveying path 2 so as to optically detect the bad mark BM. When detecting the bad mark BM, the control unit 30 is informed of the fact.

The conductive ball mounting apparatus is constructed as described above and operation thereof will be described below. In FIG. 1, the substrates 3 are conveyed on the conveying path 2, during which the sensor 31 checks out whether or not the bad mark BM is present. In this embodiment, the bad mark BM is marked on the second work 3B from the front, and the sensor 31 detects this bad mark BM to inform the control unit 30 about that.

On the other hand, the suction head 20 is moved to a position above the container 6 to perform up and down movements so as to pick up the conductive balls 7 by vacuum-sucking them in the suction holes 25. In this case, the second first valve 27B (see FIG. 4) corresponding to the second work 3B is closed to prevent the space 24B of the second suction unit 23B from being vacuum-evacuated. Therefore, the conductive balls 7 are vacuum-sucked in the suction holes 25 of the suction units 23A, 23C and 23D but they are not vacuum-sucked in the suction holes 25 of the suction unit 23B.

The suction head 20 having picked up the conductive balls 7 by vacuum suction in the above-described manner is moved to a position above the conveying path 2. Meanwhile, the substrate 3 having passed under the sensor 31 is moved to a position below the suction head 20. FIG. 5 shows the conditions at this time. As shown in FIG. 5, the conductive balls 7 are vacuum-sucked in the suction holes 25 of the suction units 23A, 23C and 23D, but no conductive balls 7 are vacuum-sucked in the suction holes 25 of the suction unit 23B corresponding to the work 3B on which the bad mark BM is marked.

Subsequently, the suction head 20 descends to cause the conductive balls 7 to contact the pads 5 (see Fig. 6). Simultaneously, the first valves 27A to 27D are closed to cancel the state of vacuum suction and the second valves 28A to 28D are opened to feed air under pressure into the spaces 24A to 24D. Then, the vacuum condition in the spaces 24A to 24D is broken and the pressure in the respective spaces 24A to 24D becomes positive. Incidentally, since no conductive balls 7 are vacuum-sucked by the suction unit 23B, it is not always necessary to open the second valve 28B. Afterwards, as the absorption head 20 ascends, the conductive balls 7 come off the suction holes 25 so as to be mounted on the pads 5 (see FIG. 7).

The substrate 3 on which the conductive balls 7 are mounted in the above-described manner is transferred on the conveying path 2 to a heating furnace (not shown) to be heated there. Then, the conductive balls 7 are caused to melt and then are solidified on the pads 5 by cooling of the substrate 3, whereby bumps 7' are finished (see FIG. 8). Subsequently, the works 3A to 3D are separated from each other by cutting of the substrate 3 along the broken lines a (see FIG. 2), so that four works 3A to 3D with bumps are finished (see FIG. 9).

Figure 10:
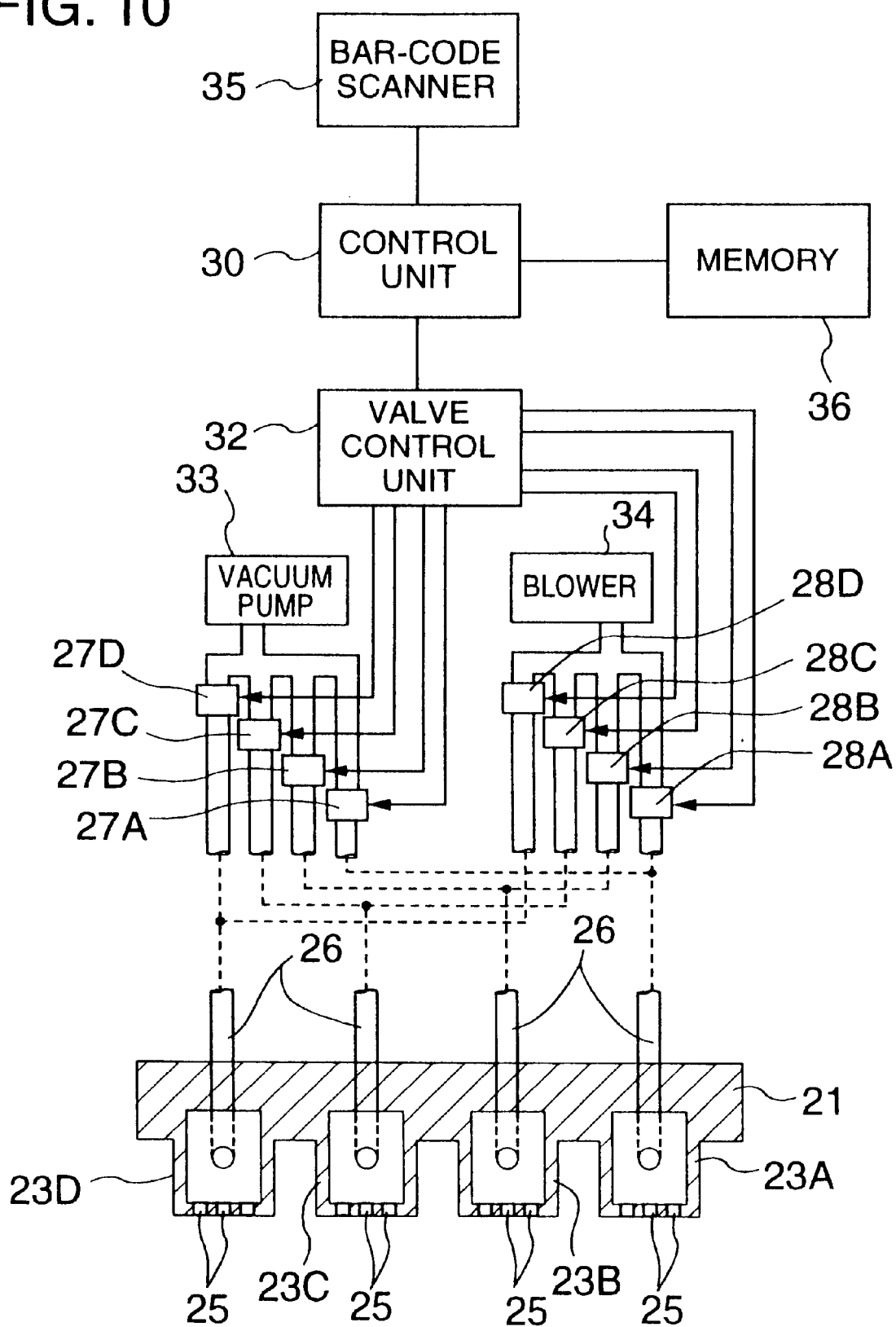
FIG. 10 is a block diagram of a vacuum suction system of a suction head of a conductive ball mounting apparatus according to a second embodiment of the invention.
Figures 11, 12:
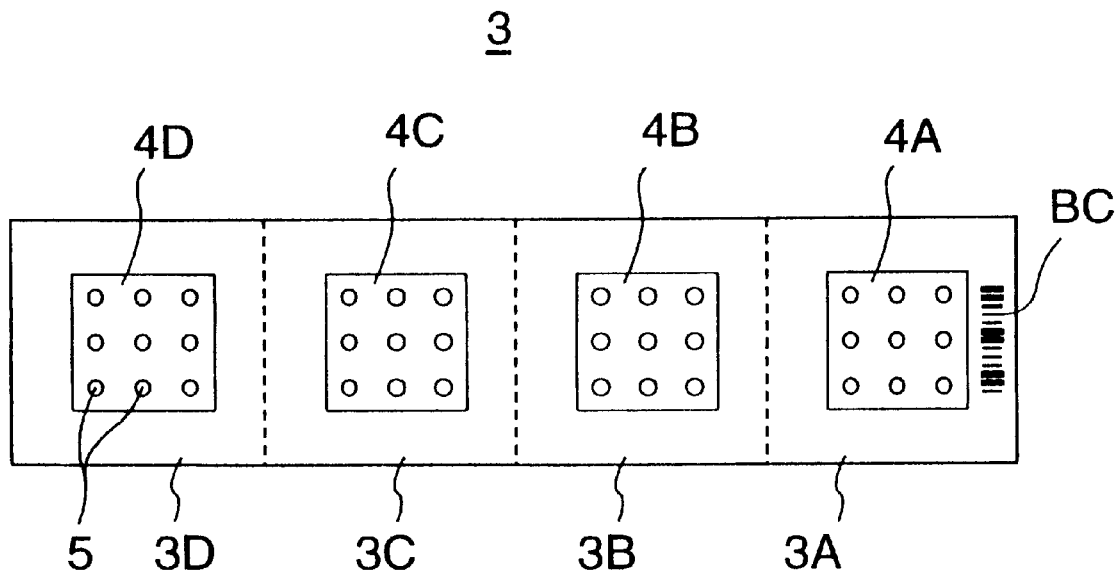
FIG. 11 is a plan view of a substrate in the second embodiment.
FIG. 12 is an output data sheet showing a product inspection of the substrates in the second embodiment.

FIG. 10 is a block diagram of a vacuum suction system of a suction head of a conductive ball mounting apparatus according to a second embodiment of the present invention, FIG. 11 is a plan view of a substrate in the embodiment, and FIG. 12 is an output data sheet showing the product inspection of the substrates in the embodiment. In FIG. 11, a bar code BC as characteristic ID (identification) is marked on a substrate 3. Further, in place of the sensor 31 shown in FIGS. 1 and 4, a bar-code scanner 35 is provided in the same position as the sensor. The bar-code scanner 35 reads the bar code BC on the substrate 3 conveyed on the conveying path 2. FIG. 12 shows the data on the product inspection of the works 3A to 3D of the substrate 3. A product inspection apparatus for the works is provided separately. The respective works 3A to 3D are beforehand inspected by the inspection apparatus for a defect in circuit pattern such as a bridge or a cavity. Results of the inspection are registered in a memory 36 (see FIG. 10). FIG. 12 shows that the second work 3B of the substrate 3 with ID00018 is a defective one. The other construction of the embodiment is the same as the first embodiment.

Next, the operation will be described. First, the bar code BC of the substrate conveyed on the conveying path 2 is read by the bar-code scanner 35. As the substrate 3 is conveyed on the conveying path 2 to a position below the suction head 20, the suction head 20 acts to mount the conductive balls 7. This mounting operation is the same as that of the first embodiment shown in FIGS. 5 to 7. Namely, the suction head 20 picks up by vacuum suction the conductive balls 7 in the container 6 and then mounts them on the pads 5 of the substrate 3. In this case, the control unit 30 collates the ID number of the substrate 3 read by the bar-code scanner 35 with the data registered in the memory 36 and, after detecting whether the works 3A to 3D of the substrate 3 have a defect or not, controls opening and closing of the first valves 27A to 27D. In the embodiment, mounting of the conductive balls 7 onto the second work 3B of the substrate 3 with ID00018 is canceled. This cancellation is performed in the same manner as the first embodiment. Namely, the first valve 27B is closed to prevent the conductive balls 7 from being vacuum-sucked in the suction holes 25 of the suction unit 23B.

According to the present invention, it is possible to mount the conductive balls on a plurality of works at one time, i.e., in a single series of actions. Further, in the case where a defective work is included in the plural works, it is possible to mount the conductive balls only on works of good quality while canceling the mounting of the conductive balls on the defective work.

What is claimed is:

1. A method of mounting conductive balls as a group on pads of a plurality of works conveyed as a group on a work conveying path, said method comprising the steps of:

(a) preparing a suction head comprising a plurality of suction units corresponding in number to said plurality of works, each of said plurality of suction units comprising a plurality of suction holes arranged in a pattern corresponding to a pattern of said pads on each of said works;

(b) inspecting said plurality of works to detect whether any defective work unsuitable for mounting thereon a conductive ball is among the plurality of works;

(c) applying a vacuum to all of said plurality of suction units for picking up said conductive balls except any suction unit which corresponds to a defective work detected in step (b);

(d) positioning said suction head over said plurality of works;

(e) lowering said suction head to place said conductive balls as a group on said works; and (f) terminating said vacuum.

2. The method according to claim 1, wherein said plurality of works is conveyed integrally as a multi-piece substrate.

3. The method according to claim 1, further comprising initiating a flow of air under positive pressure to said suction units to ensure release of said conductive balls from said suction holes.

4. The method according to claim 1, wherein step (a) comprises preparing said respective suction units of said suction head to include separate spaces in communication with said suction holes, tubes connected to said spaces for conducting a vacuum to said spaces, and valves for opening and closing said tubes, and said method further comprises preparing a control means for controlling opening and closing of said valves based on results of step (b).

* * * * *